United States Patent
Kuno

(10) Patent No.: US 6,498,309 B2
(45) Date of Patent: Dec. 24, 2002

(54) CIRCUIT BOARD AND MANUFACTURING METHOD THEREOF

(75) Inventor: Takehito Kuno, Nisshin (JP)

(73) Assignee: Maspro Denkoh Co., LTD, Aichi (JP)

( * ) Notice: Subject to any disclaimer, the term of this patent is extended or adjusted under 35 U.S.C. 154(b) by 0 days.

(21) Appl. No.: 09/778,425

(22) Filed: Feb. 7, 2001

(65) Prior Publication Data

US 2001/0025726 A1 Oct. 4, 2001

(30) Foreign Application Priority Data

Feb. 8, 2000 (JP) ........................................ 2000-030922

(51) Int. Cl.[7] .............................. H05K 1/00; H05K 1/03; H05K 1/09
(52) U.S. Cl. ................... 174/268; 174/255; 174/256; 361/746; 361/792; 428/209
(58) Field of Search .................. 174/268, 254, 174/255, 258, 259, 256, 257, 260; 361/746, 750, 751, 760, 720, 792; 428/209, 458

(56) References Cited

U.S. PATENT DOCUMENTS

| | | | |
|---|---|---|---|
| 4,549,043 A | * 10/1985 | Kalubowila et al. | .... 174/133 R |
| 5,252,383 A | * 10/1993 | Fukutake et al. | ........... 428/209 |
| 5,311,406 A | * 5/1994 | Snodgrass et al. | ........... 361/792 |
| 5,552,210 A | * 9/1996 | Horn, III et al. | ............ 428/209 |
| 5,916,695 A | * 6/1999 | Fister et al. | ................. 428/647 |
| 6,183,886 B1 | * 2/2001 | Chen et al. | .................. 428/647 |
| 6,218,015 B1 | * 4/2001 | Allen et al. | .................. 428/422 |
| 6,258,449 B1 | * 7/2001 | Nagasawa et al. | .......... 428/209 |
| 6,296,949 B1 | * 10/2001 | Bergstrsser et al. | ......... 428/626 |

FOREIGN PATENT DOCUMENTS

JP    07122850 A  *  5/1995

* cited by examiner

Primary Examiner—Kamand Cuneo
Assistant Examiner—I B Patel
(74) Attorney, Agent, or Firm—Pearson & Pearson, LLP

(57) ABSTRACT

The present invention provides a circuit board, which can reduce a conduction loss and generate no trouble in electric/electronic apparatuses in the case of being mounted to electric/electronic apparatuses adapting a high frequency current.

A circuit board 1 is formed a manner that a copper foil layer 2 and a copper layer 3 are laminated on a base material 5 made of polytetrafluoroethylene so as to form a predetermined circuit, and further, a tin plating layer 4 is laminated on these copper layers.

1 Claim, 4 Drawing Sheets

CIRCUIT BOARD AND MANUFACTURING METHOD THEREOF

BACKGROUND OF THE INVENTION

1. Field of the Invention

The present invention relates to a circuit board, which is mounted to electric/electronic apparatuses adapting to a high frequency current.

2. Description of the Prior Art

Conventionally, a circuit board formed in the following manner has been known. More specifically, a conductive circuit is formed on a base material (insulating substrate) made of synthetic resin excellent in a dielectric strength. In the circuit board thus formed, the conductive circuit is formed using copper as a base excellent in a conductivity (electric conductivity). However, the copper is inferior to a corrosion resistance; for this reason, a material having a high conductivity and excellent corrosion resistance must be laminated on a layer made of cooper. Preferably, gold is usable as the above material. However, the gold is diffused in copper; for this reason, in general, a slight thick anchor layer of nickel (about 4 to 5 $\mu$m) is laminated on the surface of copper, and further, gold is laminated on the anchor layer. Thus, a circuit board 11 as shown in FIG. 5 has been known as a conventionally normal circuit board. The conventional circuit board is formed in the following manner. More specifically, a layer 12 made of copper is laminated on a base material 16, and a nickel plating layer 14 is laminated on the layer 12 made of copper, and further, a gold plating layer 15 is laminated on the nickel plating layer 14. In this case, gold is high expensive; for this reason, normally, the gold is plated extremely thin, that is, less than a thickness of about 0.1 $\mu$m.

In general, in the case where a high frequency current flows through a conductor, a skin effect is generated such that the current is limited to a surface layer of circuit; for this reason, almost no current flows through the conductor. Therefore, for example, in the case where the aforesaid circuit board 11 is used for electric/electronic apparatuses adapting to high frequency current, such as a high performance amplifier and converter, a current having a very high frequency of about 20 GHz flows through the circuit. For this reason, theoretically, a current flows through a part up to a depth of about 0.45 $\mu$m from the surface of circuit. Thus, in the conventional circuit board 11, most of current flows through the layer 14 made of nickel; for this reason, a conduction loss becomes high. As a result, a problem arises such that a noise figure of the used high performance amplifier and converter increases.

SUMMARY OF THE INVENTION

The present invention has been made in order to solve the above problem arisen in the conventional circuit board such as the above circuit board 11. It is, therefore, an object of the present invention to provide a circuit board, which can reduce a conduction loss and generate no trouble in electric/electronic apparatuses in the case of being mounted to electric/electronic apparatuses adapting a high frequency current.

Inventors of the present invention have found the following matter. More specifically, in a circuit part of circuit board, a material having a high conductivity is much provided on a part up to a depth of about 0.45 $\mu$m from the surface of circuit through which a frequency current of about 20 GHz flows, and thereby, it is possible to reduce a conduction loss of the circuit board for high frequency, and thus, the inventors have proposed the present invention.

According to a first aspect, the present invention provides a circuit board, which is constructed in a manner that a conductive circuit is formed on a base material made of polytetrafluoroethylene (Teflon etc., manufactured by du Pont) the conductive circuit being formed by laminating a layer made of tin on a layer made of copper.

Further, according to a second aspect, the present invention provides the circuit board wherein the layer made of copper has a thickness less than 0.45 $\mu$m.

Furthermore, according to a third aspect, the present invention provides a manufacturing method of a circuit board, comprising the following steps of: forming a copper foil on a base material made of polytetrafluoroethylene; subjecting copper plating onto the copper foil layer; and subjecting tin plating onto the copper plated layer.

DETAILED DESCRIPTION OF THE PREFERRED EMBODIMENTS

A circuit board according to one embodiment of the present invention will be described below with reference to the accompanying drawings.

Manufacture of Circuit Board of this Embodiment

Figure 1:
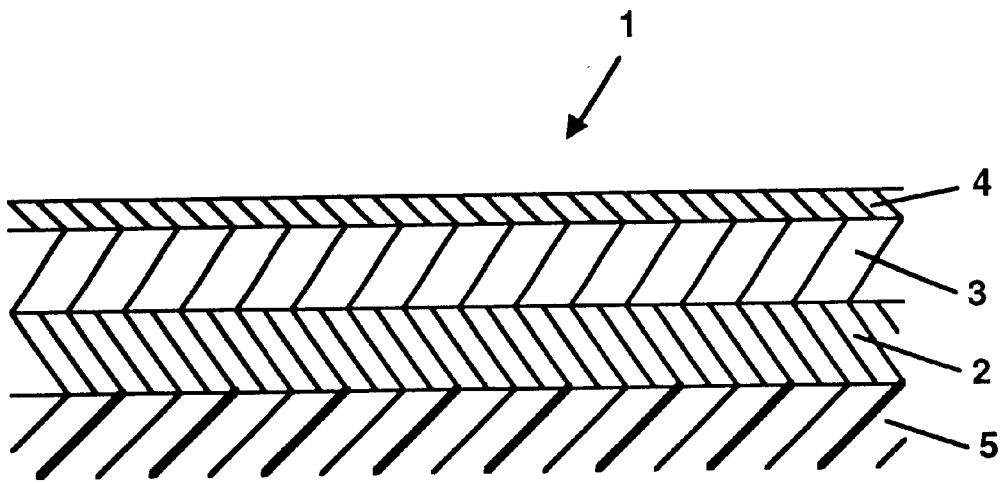
FIG. 1 is a view to explain a cross section of a circuit board According to the present invention.

A circuit board of this embodiment was obtained in the following manner. More specifically, a predetermined microwave strip circuit was formed on a base material made of polytetrafluoroethylene (Teflon), and thereafter, copper plating was subjected onto a copper foil so as to form a thickness of about 18 $\mu$m. Thereafter, tin plating (tinning) was subjected onto the copper plating layer so as to form a thickness of about 0.3 $\mu$m, and thereby, the circuit board of this embodiment was obtained. The circuit board thus obtained is shown in FIG. 1. A circuit board 1 is constructed in a manner that a copper foil layer 2, a copper plating layer 3 and a tin plating layer 4 are laminated on a base material 5 in the named order.

Manufacture of Circuit Board of Comparative Example

Figure 5:
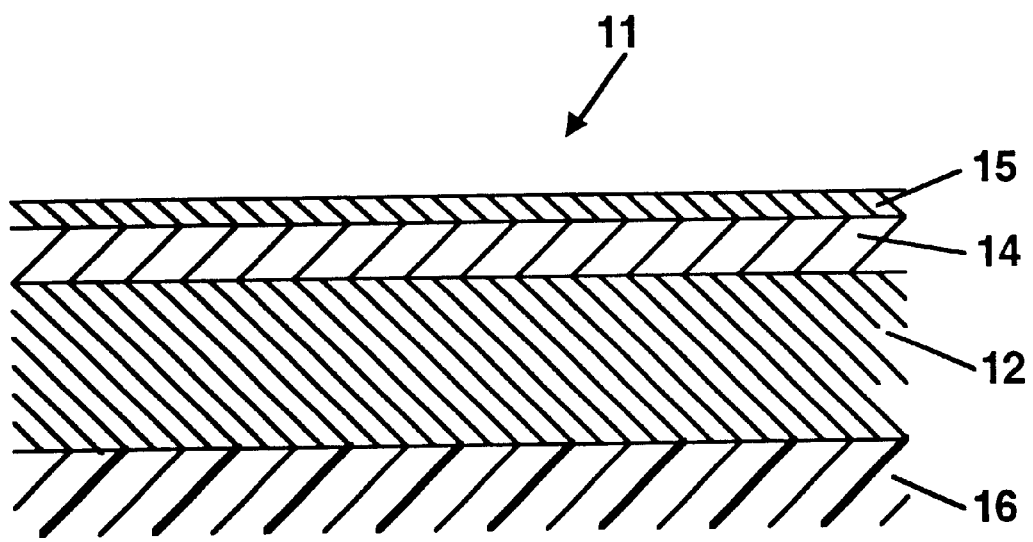
FIG. 5 is a view to explain a cross section of a conventional circuit board.

A circuit board of the comparative example was obtained in the following manner. More specifically, like the circuit of this embodiment, a circuit was formed on a base material made of polytetrafluoroethylene (Teflon) using a copper foil of about 18 $\mu$m, and thereafter, copper plating was subjected onto the copper foil so as to form a thickness of about 18 $\mu$m. Thereafter, nickel plating was subjected onto the copper plating layer so as to form a thickness of about 4 $\mu$m, and further, gold plating was subjected onto the nickel plating layer so as to form a thickness of about 0.03 $\mu$m, and there by, the circuit board of the comparative example was obtained. The circuit board thus obtained has the same structure as shown in FIG. 5.

Figure 2:
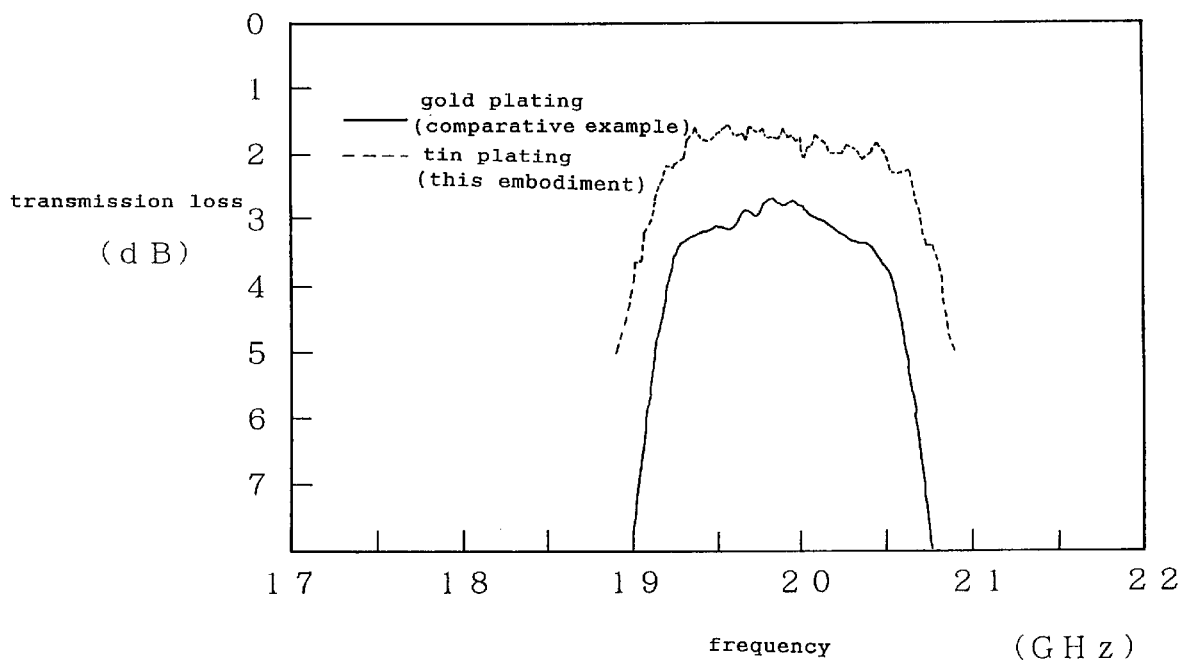
FIG. 2 is a chart to explain a measured result of conduction loss (transmission loss)
Figure 3:
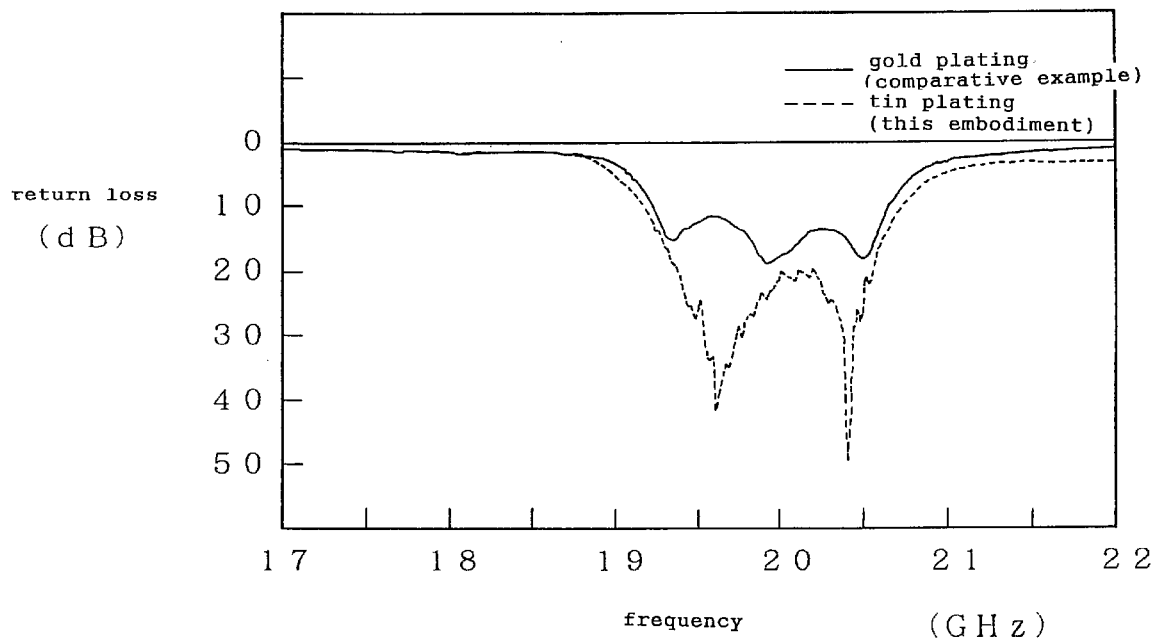
FIG. 3 is a chart to explain a measured result of conductive loss return loss)
Figure 4:
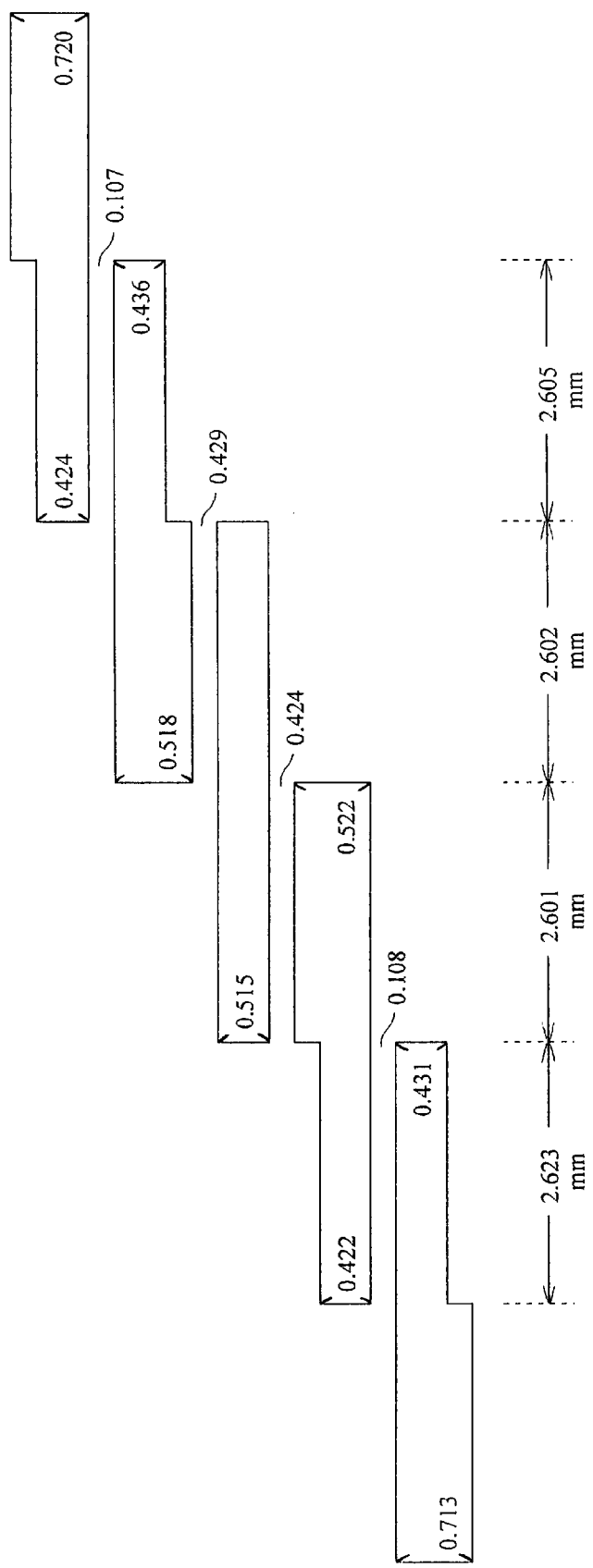
FIG. 4 is a view showing a filter used when measuring a conduction loss.

Then, using the circuit boards of this embodiment and the comparative example thus obtained, a conduction loss (transmission loss and return loss) was measured in the case where a high frequency current of 17 to 22 GHz flows through there. In this measurement, a filter (parallel-coupled resonator filter) as shown in FIG. 4 was used. Measured results of transmission loss and return loss are shown in FIG. 2 and FIG. 3, respectively. As seen from FIG. 2, the circuit board of this embodiment has a transmission loss smaller than the circuit board of the comparative example in the vicinity of 20 GHz. More specifically, the transmission loss of the circuit board of this embodiment is about 2.0 dB in the vicinity of 20 GHz; on the other hand, the transmission loss of the circuit board of the comparative example embodiment is about 2.8 dB in the vicinity of 20 GHz. Meanwhile, as seen from FIG. 3, the circuit board of this embodiment has a return loss larger than the circuit board of the comparative example in the vicinity of 20 GHz. More specifically, the return loss of the circuit board of this embodiment is about 20 dB in the vicinity of 20 GHz; on the other hand, the transmission loss of the circuit board of the comparative example embodiment is about 15 dB in the vicinity of 20 GHz. Therefore, it is found that a current is easy to flow through the circuit board of this embodiment better than the circuit board of the comparative example.

In the circuit board 1 of this embodiment, a conduction loss is very small in the case where a high frequency current flows through there because the conductive circuit is formed in a manner of laminating layer made of tin on the copper layer as described above. Therefore, a noise figure is low in the case where the circuit board of this embodiment is used to a high performance amplifier adapting to a high frequency current, etc.

Further, in the circuit board 1 of this embodiment, the tin-plating layer has a thickness less than 0.45 µm, and in the case where a high frequency current of about 20 GHz flow, a current flows through the copper plating layer at a very high rate. Therefore, it is possible to greatly reduce a noise figure in the case where the circuit board of this embodiment is used to a low noise amplifier through which a high frequency current of about 20 GHz, etc.

Furthermore, a manufacturing method of the circuit board 1 is as follows. More specifically, as described above, a circuit is formed using a copper foil on a base material made of polytetrafluoroethylene, and thereafter, copper plating is subjected onto the copper foil layer, and further, tin plating is subjected thereon. As seen from the above method, no expensive gold is used unlike the conventional manufacturing method of circuit board; therefore, according to the manufacturing method of the present invention, it is possible to manufacture the circuit board at a low cost. In addition, a layer made of tin may be directly laminated on the layer made of copper; therefore, an anchor layer is unnecessary, so that a circuit board can be readily manufactured.

The circuit board of the present invention and the manufacturing method thereof are not limited to the above embodiment, and the construction of base material, circuit or the like may be modified as the need arises within a scope of this invention without diverging from the gist of this invention. For example, the layer made of copper is not limited to a laminate formed in a manner of laminating the copper plating layer on a copper foil, and may be mere copper consisting of copper foil, or may be a mere copper plating layer. Moreover, the above plating method is not limited to chemical plating and electroplating, and vacuum deposition, spattering, ion plating spraying or the like may be employed. The base material is not limited to polytetrafluoroethylene, and may be formed of other insulating synthetic resin. In particular, the polytetrafluoroethylene is excellent in a dielectric performance against high frequency current; therefore, it is preferably applicable to the circuit board of the present invention. Each thickness of layers made of copper and tin may be properly modified in accordance with a frequency to which the circuit board is applied.

As is evident from the above description, the circuit board described in the first aspect is constructed in a manner that a conductive circuit is formed by laminating the layer made of tin on the layer made of copper; therefore, it is possible to greatly reduce a conduction loss in the case where a high frequency current flows. Moreover, it is possible to reduce a noise figure in the case where the circuit board is used for a high performance amplifier adapting a high frequency current, etc.

Further, the circuit board described in the second aspect is constructed in a manner that the layer made of copper has a thickness less than 0.45 µm, and a current flows through the layer made of copper at an extremely high rate in the case where a high frequency current of about 20 GHz flows through the circuit board. Therefore, it is possible to reduce a noise figure in the case where the circuit board is used for a low noise amplifier through which a high frequency current of about 20 GHz flows, etc.

Furthermore, the manufacturing method of the circuit board described in the third aspect is as follows. More specifically, a copper foil is laminated on a base material made of polytetrafluoroethylene, and thereafter, copper plating is subjected onto the copper foil layer, and further, tin plating is subjected thereon. Therefore, there is no need of laminating expensive gold unlike the conventional manufacturing method of circuit board, so that the circuit board can be manufactured at a low cost. In addition, a layer made of tin may be directly laminated on the layer made of copper; therefore, an anchor layer is unnecessary, so that a circuit board can be readily manufactured.

What is claimed is:

1. A circuit board, which is constructed in a manner that a conductive circuit is formed on a base material made of polytetrafluoroethylene, the conductive circuit being formed by laminating a layer made of tin on a layer made of copper, said layer made of copper being applied to said base material and said layer made of tin having a thickness of less than 0.45 µm.

* * * * *